United States Patent
Zimek (10) Patent No.: US 7,990,128 B2
(45) Date of Patent: Aug. 2, 2011

(54) CIRCUIT AND METHOD FOR PULLING A POTENTIAL AT A NODE TOWARDS A FEED POTENTIAL

(75) Inventor: Bernd Zimek, Graz (AT)

(73) Assignee: Infineon Technologies AG, Neubiberg (DE)

( * ) Notice: Subject to any disclaimer, the term of this patent is extended or adjusted under 35 U.S.C. 154(b) by 520 days.

(21) Appl. No.: 12/109,882

(22) Filed: Apr. 25, 2008

(65) Prior Publication Data
US 2009/0267586 A1 Oct. 29, 2009

(51) Int. Cl.
G05F 3/08 (2006.01)
G05F 3/04 (2006.01)

(52) U.S. Cl. .......................... 323/312; 323/313; 323/314
(58) Field of Classification Search .................. 323/312, 323/313, 314
See application file for complete search history.

(56) References Cited

U.S. PATENT DOCUMENTS

| | | | | |
|---|---|---|---|---|
| 5,278,491 A * | 1/1994 | Nitta et al. | ..................... | 323/313 |
| 5,315,230 A * | 5/1994 | Cordoba et al. | .............. | 323/313 |
| 6,043,638 A * | 3/2000 | Tobita | ........................... | 323/313 |
| 7,173,406 B2 * | 2/2007 | Rategh | ........................... | 323/314 |
| 7,576,524 B2 * | 8/2009 | Ohoka | ........................... | 323/275 |
| 7,602,162 B2 * | 10/2009 | Bansal et al. | .................. | 323/277 |
| 2003/0011952 A1 * | 1/2003 | Fukui | ........................... | 361/93.1 |
| 2005/0285586 A1 * | 12/2005 | Rategh et al. | .................. | 323/314 |

* cited by examiner

Primary Examiner — Bao Q Vu
(74) Attorney, Agent, or Firm — Dickstein Shapiro LLP (57) ABSTRACT

Embodiments of the invention concern a circuit for pulling a potential at a node towards a feed potential which is present at a potential feed. The circuit has a first transistor with a controllable conductive path and in addition a resistive element. The controllable conductive path of the first transistor and the resistive element are coupled in series between the potential feed and the node. Furthermore, the circuit has a control element configured to control the first transistor so that a resistance of the controllable conductive path of the first transistor can be changed depending on a voltage drop at the resistive element. Furthermore, a method for pulling a potential at a node towards a feed potential and an integrated circuit with a pad which is pulled to the feed potential in the absence of an information carrying signal which is received or send by a functional circuitry of the integrated circuit.

26 Claims, 6 Drawing Sheets

```
┌─────────────────────────────────────┐
│  Changing a resistance of a control  │
│  element depending on a voltage drop │──62
│  at a resistive element              │
└─────────────────────────────────────┘
```

```
┌─────────────────────────────────────┐
│  Increasing the resistance of a      │
│  transistor in series with the       │
│  resistive element with an           │──64
│  increasing voltage drop at the      │
│  resistive element                   │
└─────────────────────────────────────┘
```

```
┌─ ─ ─ ─ ─ ─ ─ ─ ─ ─ ─ ─ ─ ─ ─ ─ ─ ─ ┐
│  Limiting a current flow from a feed │──66
│  potential to the node with the      │
│  resistive element                   │
└─ ─ ─ ─ ─ ─ ─ ─ ─ ─ ─ ─ ─ ─ ─ ─ ─ ─ ┘
```

FIG 6

CIRCUIT AND METHOD FOR PULLING A POTENTIAL AT A NODE TOWARDS A FEED POTENTIAL

TECHNICAL FIELD

Embodiments according to the invention relate to a circuit for pulling a potential at a node towards a feed potential present at a potential feed. Some embodiments relate to a pull-up circuit or a pull-down circuit, and a method for pulling a potential at a node towards a feed potential.

BRIEF DESCRIPTION OF THE DRAWINGS

Embodiments according to the invention will be described subsequently taking reference to the enclosed drawings in which.

DETAILED DESCRIPTION OF THE EMBODIMENTS

With reference to the accompanying FIGS. 1-6, embodiments are described which relate to a circuit for pulling a potential at a node towards a feed potential, as well as a method for doing same.

Embodiments according to the invention are directed to pull up and pull down circuits. Such pull-up or pull-down circuits may be coupled to pads of an integrated circuit. In general, it is the task of such pull-up circuits, or pull-down circuits, to maintain the voltage level of a pad at a predetermined value. This means that using such circuits, a node can be maintained at a stable state and a floating of the node or of the pad can be avoided. The node may, for example, be an input/output (I/O) pad of an integrated circuit (IC).

Figure 1:
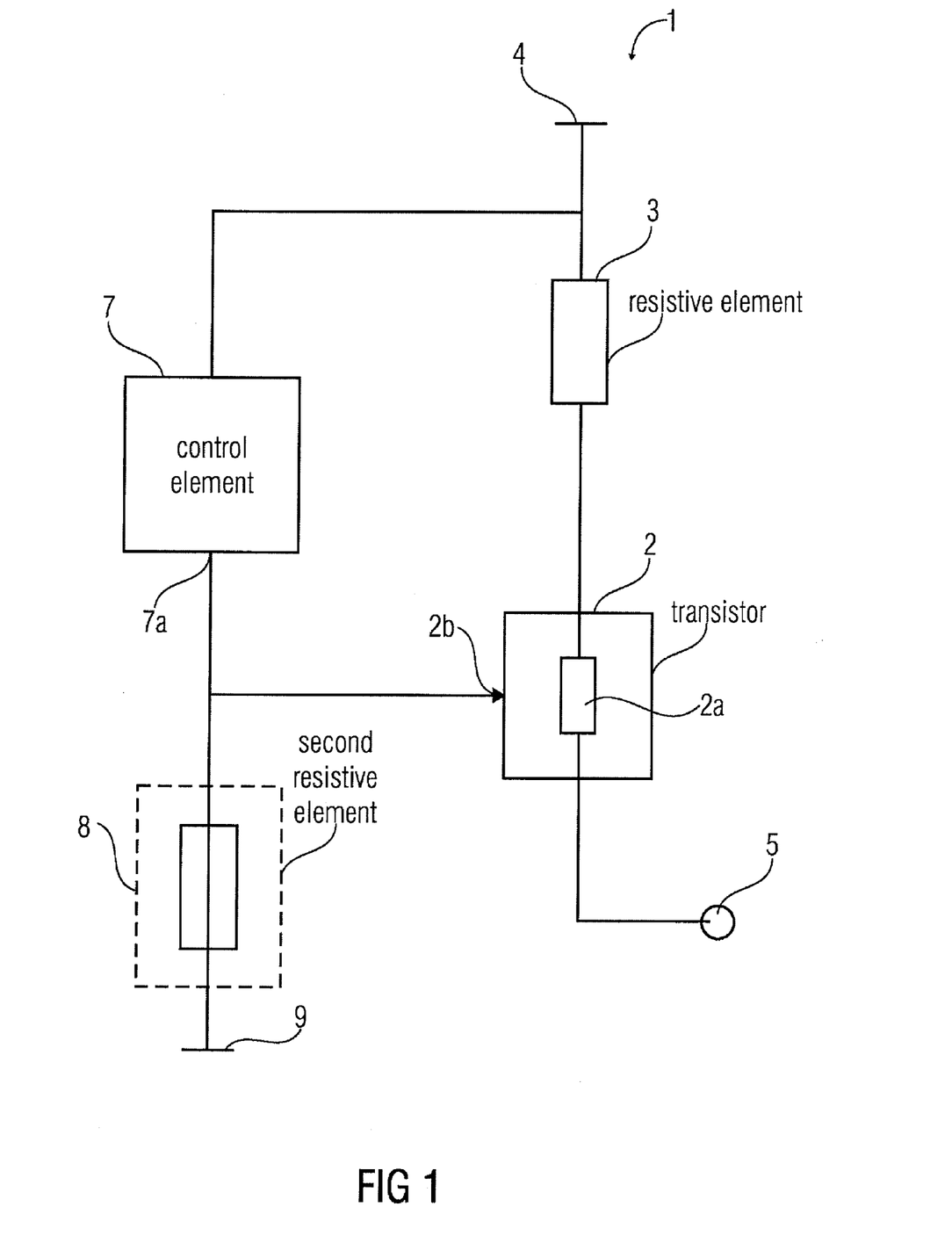
FIG. 1 shows a schematic drawing of a circuit according to an embodiment of the invention.

FIG. 1 shows a simplified block diagram of a circuit for pulling a potential at a node towards a feed potential present at a potential feed according to an embodiment of the invention. In the embodiment depicted in FIG. 1, the circuit 1 comprises a first transistor 2 comprising a controllable path 2a. The circuit also comprises a resistive element 3, wherein the conductive path 2a of the first transistor 2 and the resistive element 3 are coupled in series between a potential feed 4 and a node 5. The circuit further comprises a control element 7, which is configured to control the first transistor 2, to change the resistance of the controllable conductive path 2a of the first transistor 2, depending on a voltage drop at the resistive element 3.

The circuit 1 may further comprise a second resistive element 8, which may be configured as a load resistor or biasresistor. The second resistive element may be coupled between the control element 7 and a second potential, which may be present at a second potential feed 9, which is configured to carry the second feed potential.

The control element 7 may be configured such that the control element 7 controls the first transistor 2. Therefore, the control element may be coupled to a control terminal of the first transistor for controlling the controllable path 2a. The control element 7 may be able to control the first transistor to increase the resistance of the controllable conductive path 2a with an increasing voltage drop at the resistive element 3. This means that, depending on the voltage drop (for example of a potential present at the potential feed 4) at the resistive element 3, the control element is influenced such that the control element provokes or controls the first transistor to increase the resistance of the controllable conductive path 2a with increasing voltage drop at the resistive element 3.

The control element 7 may be a field effect transistor (FET) and may comprise a respective threshold voltage (Vth). The control element 7 can be configured such that a current flow through the control element is increased, if the voltage drop at the resistive element 3 is such that a voltage at the control element is higher than the threshold voltage of the FET. As a consequence, the resistance of the controllable conductive path of the first transistor 2 may be increased (for example drastically), for example by pulling the control terminal 2b to an appropriate potential. For example, the control element 7 may couple the control terminal 2b to the potential of the potential feed 4. For example, the control element 7 may decrease a resistance of a controlled path between the potential feed 4 and the control terminal 2b.

Figure 2:
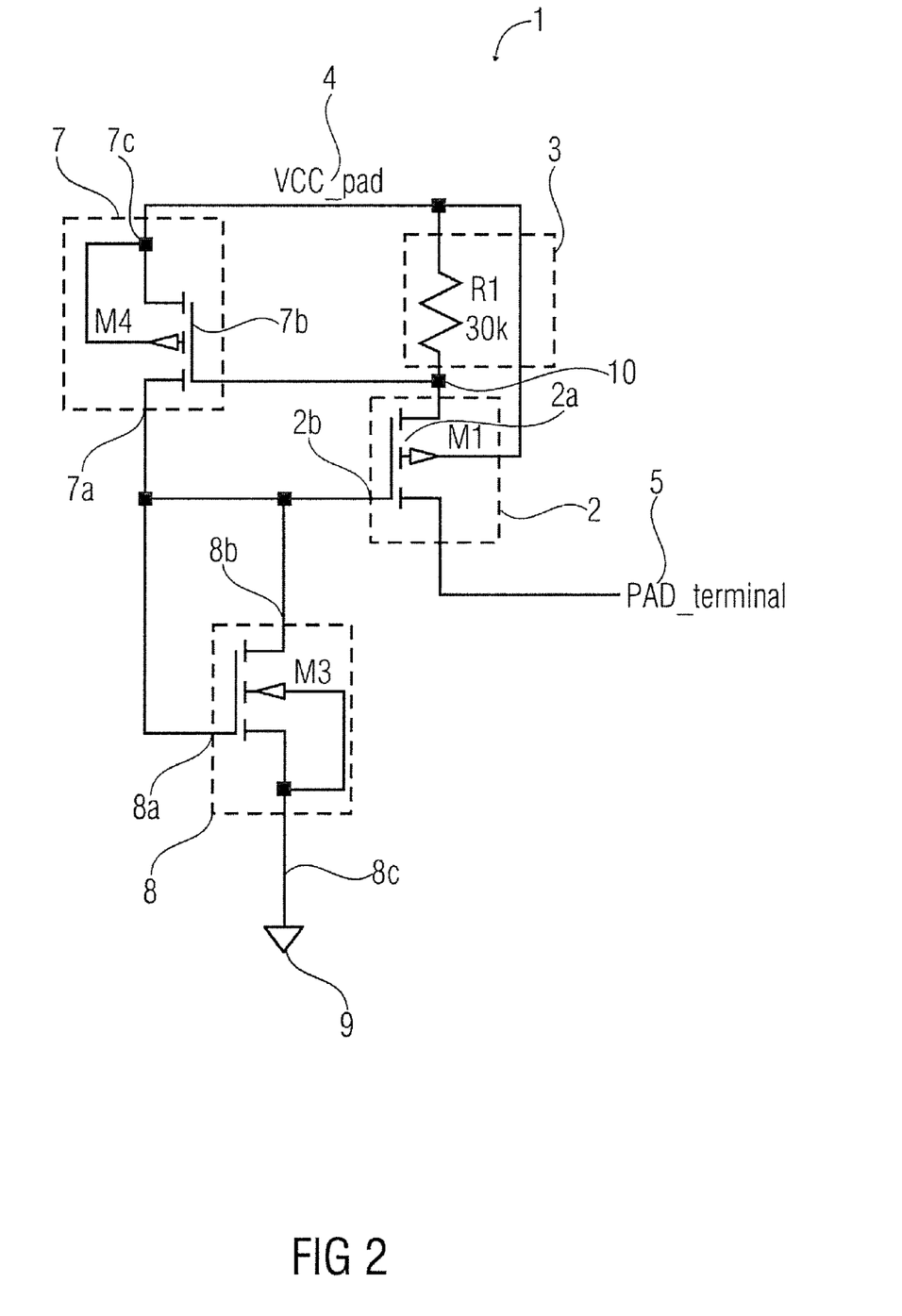
FIG. 2 shows a circuit diagram of a circuit comprising field effect transistors and a resistance according to an embodiment of the invention.

FIG. 2 shows another circuit diagram according to an embodiment of the invention. The circuit 1 may be a pull-up circuit. At the potential feed 4, a pad voltage supply VCC_pad may be present. The node 5 may be configured as a pad terminal (PAD_terminal) 5. In this embodiment, the resistive element 2 comprises a 30 KΩ resistor R1, which is connected in series to a p-channel field effect transistor M1. The controllable conductive path 2a is formed by the controllable channel of the p-channel FET M1. The resistor R1 and the transistor M1 are coupled in series between the pad voltage supply 4 (VCC_pad) and the 0pad terminal 5. The control element 7, in this embodiment, includes another p-channel FET M4. The control terminal 7b of the p-channel FET M4 may be connected to a node 10, which is arranged between the resistor R1 and the p-channel FET M1. The p-channel transistors M1 and M4 can be manufactured in a standard CMOS technology. A source terminal 7c of the FET M4 is connected to the feed potential 4 (VCC_pad). The drain terminal 7a of the p-channel transistor 7 (M4) is coupled to the control terminal 2b (or gate terminal) of the transistor 2. The resistive element 8, is, in this embodiment, formed by a n-channel FET M3, wherein the control terminal 8a and the drain terminal 8b of the n-channel FET M3 are connected to the drain terminal 7a of the p-channel FET M4 and to the control terminal 2b of the p-channel FET M1. A source terminal 8c of the n-channel transistor 8 is connected to a second potential feed 9, which comprises a second potential. In this embodiment, the second potential may be a ground potential. The n-channel transistor M3 may act as a load transistor or/and resistor which is coupled between the control element 7 (or an output terminal 7 thereof) and the second potential present at the second potential feed 9.

In the following, the functions of the circuit shown in FIG. 2 will be described. A voltage VCC_pad present at the potential feed 4 (or at least a part of the voltage VCC_pad) may drop at the resistor R1, wherein depending on the resistor value, and thus on the voltage drop, a gate voltage is applied to the control terminal 7b of the FET M4. Thus, a gate-source voltage at the FET 114 may be dependent on, or even identical to, the voltage drop across the resistor R1. If the gate source-voltage between the gate terminal 7b and the source terminal 7c is higher than the threshold voltage of the respective FET, the resistance of the transistor between the source terminal 7c and the drain terminal 7a (i.e. the resistance of the controlled path of the FET 114) is drastically reduced. In other words, the transistor M4 is in an on-state and comprises, compared to an off-state, a drastically reduced resistance. Since the transistor M4 is coupled to the control terminal or gate terminal 2b of the p-channel FET 111, the resistance of the p-channel FET M1 (or the resistance of the drain source path thereof) is increased and hence the current flow from the potential feed 4 to the pad terminal 5 is reduced, depending on the resistor R1. The voltage which is roughly applied at the control terminal 2b of the FET M1 may be the difference between the voltage VCC_pad and the threshold voltage ($V_{th}$) of the p-channel FET M4.

In other words, the current through the pull-up circuit passes the resistor R1, wherein the voltage drop at the resistor R1 is compared to the transistor threshold voltage $V_{th}$ of the transistor M4. If the applied voltage at the gate of the transistor M4 (or the gate-source voltage at the transistor M4) exceeds the threshold voltage, the transistor M4 is turned on. As a consequence, the resistance of the pull-up circuit between the pad terminal 5 and the feed potential 4 is actively increased by the serial transistor M1, which is coupled with its control terminal 2b to the transistor M4. Therefore, the transistor M4 is "measuring" the current and the voltage drop, respectively, through the resistor R1, and controls the transistor M1 such that the transistor M1 increases the pull-up resistance of the pull-up circuit 1 at an excess of the current depending on the resistor R1. In other words, the current through the resistor R1 causes a voltage drop. The potential at the gate terminal of the transistor 114 is dependent on the voltage drop. If the voltage drop over the resistor R1 increases, a gate-source voltage (or a magnitude thereof) increases. If the magnitude of the gate-source voltage of the transistor M4 reaches or exceeds the threshold voltage of the transistor 114, the transistor 114 drives the gate terminal of the transistor 111, such that the resistance of the drain-source path of M1 is increased. The pull-up resistance is increased.

In this embodiment, the p-channel FET M4 is coupled to the resistor R1, such that the control voltage or gate-source voltage of the p-channel FET M4 increases with increasing voltage drop at the resistor R1.

The transistors M1, M4 and M3 may be formed as p-channel or n-channel metal oxide field effect transistors (MOSFET), depending on the circuit in which they are included. In the case of the depicted pull-up circuit, M1 and M4 may be formed as p-channel MOSFET transistors and M3 may be formed as an n-channel MOSFET transistor. In another embodiment for a pull-down circuit, the transistor M1 and M4 may be formed as n-channel MOSFET transistors, with the transistor M3 being formed as a p-channel MOSFET transistor. Alternatively, bipolar transistors may be used.

The current of a pull-up circuit or pull-down circuit in a pad may for example comprise a voltage-independent maximum and/or minimum. With regard to the circuit described above, the current in the pull-up or pull-down circuit may comprise a voltage dependent minimum and maximum current limit.

So far, pull-up or pull-down circuits at pads for microchips may include a resistor or a transistor. With respect to variations of the manufacturing process, temperature and/or voltage, the current in such a pull-up or pull-down circuit may radically change.

The usage of a resistor in pull-up or pull-down circuits, generally shows (or brings along) an improved behavior with regard to the variation of the current depending on the voltage, process variations and/or temperature compared to a conventional transistor solution.

A pull-up circuit in an ISO pad with a transistor comprises, for instance, a current flow variation of nearly factor 100, at supply voltages (VCC) between 1.62 V and 5.5 V, over a wide temperature range and over a process variation between the slow corner and the fast corner of the respective manufacturing process.

The current flow in a pull-down circuit with a resistor with an accuracy of ±10% may, for example, vary with a factor 5, if the respective voltage VCC varies nearly with the same factor. Additional variation may come from temperature range and process corners. The respective voltage VCC may, for example, vary between 1.62 V and 5.5 V, the temperature may vary over a wide temperature range, and the process variation of the manufacturing process may vary between the slow corner and the fast corner.

In contrast to conventional pull-up circuits and pull-down circuits, in some embodiments according to the invention, a maximum and a minimum current in the pull-up or pull-down circuit may, for example, vary with a factor 1.5 during operation. Those values may be achieved, for example, in a voltage range between 1.62 V and 5.5 V (VCC), for a wide temperature range and for a manufacturing process variation from the slow process corner to the fast process corner. This means that the current variation range, for example, with a factor 1.5, is smaller, compared to the conventional approach mentioned above. However, there are some embodiments which do not bring along such a significant improvement of the variation of the pull-up current or pull-down current.

A further advantage of some circuits described according to some embodiments according to the invention is the fact that less area may be wasted when implementing the circuit, compared to the conventional approach with a pull-up/-down resistor. Moreover, in some circuits according to embodiments of the invention, one can limit the current flow in the circuit easily by changing or adapting the resistive element 2 in the circuit 1 to respective needs. The circuit described in FIG. 2 can be used as a pull-up circuit, and by changing the polarities of the transistors it can be also used as a pull-down circuit.

In embodiments according to the invention, the circuit may be a pull-up circuit, and the feed potential may be between 1.5 V and 6 V or less than 6V. In another embodiment according to the invention, the circuit may be a pull-down circuit and the feed potential may be a ground potential. According to embodiments, the circuit 1 may be configured such that a current flow, during the pulling of a node towards a feed potential, between the feed potential and the node may be between 1 µA and 100 µA.

The resistive element 2 may comprise a resistance between 5 kΩ and 100 kΩ according to embodiments.

In another embodiment according to the invention, the circuit is configured such that the current through the conductive path of the first transistor 2 in a pull-up state or pull-down state may vary between 10% to 100% (for example over a given temperature range, supply voltage range or process variation range).

Figure 3:
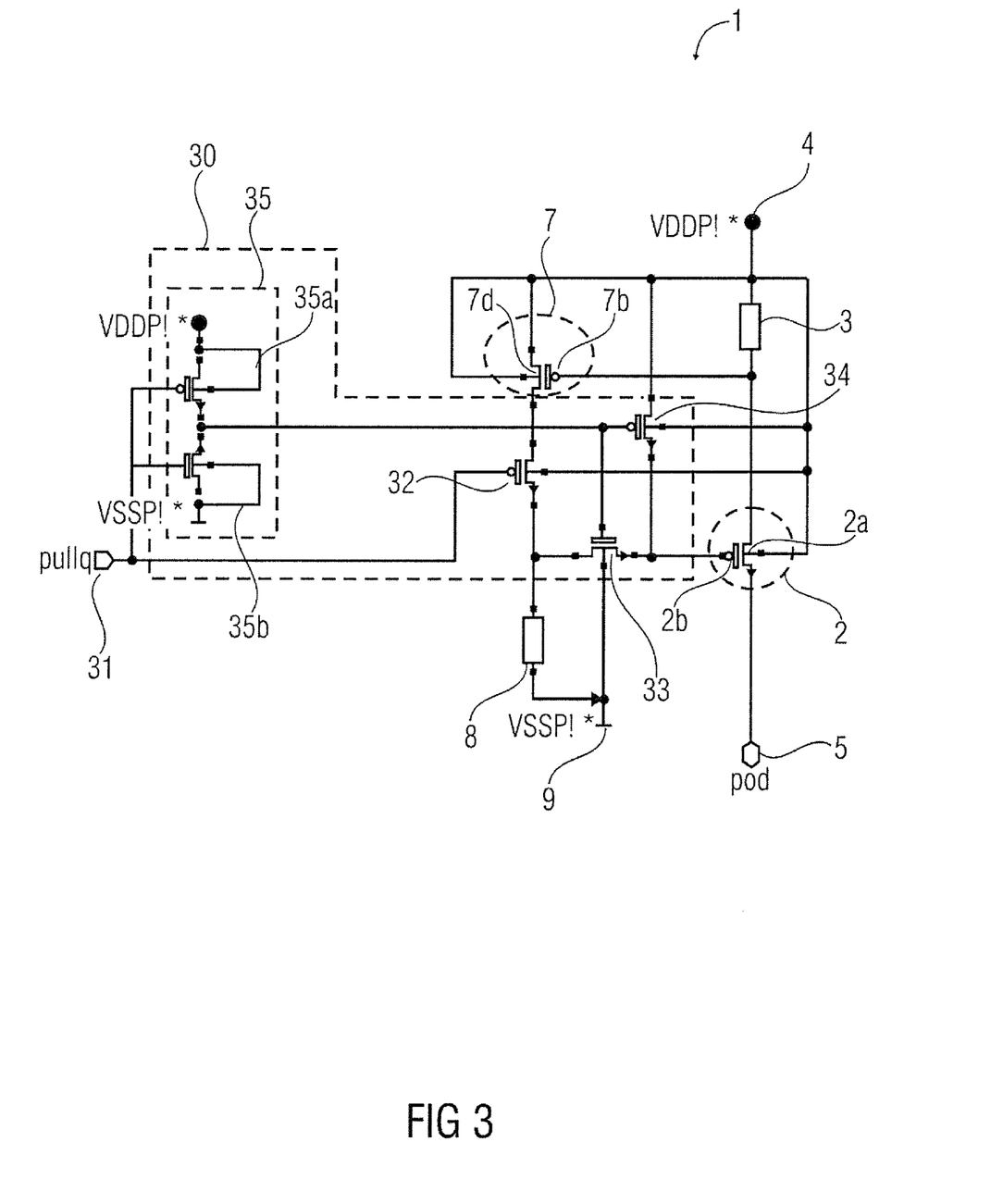
FIG. 3 shows a circuit diagram of a pull-up circuit with a sub-circuit for enabling the pull up circuit according to an embodiment of the invention.

In FIG. 3, a circuit diagram according to another embodiment of the invention is shown. The depicted circuit 1 is a pull-up circuit 1 for pulling a potential at a pad 5 towards a feed potential VDDP!*, present at a potential feed 4. The circuit 1 comprises a p-channel MOSFET 2 with a controllable path 2a and a resistive element 3 wherein the conductive path 2a of the p-channel MOSFET 2 and the resistive element 3 are coupled in series between the potential feed 4 and the pad 5. The circuit 1 further comprises a p-channel MOSFET 7 with a control terminal 7b configured to change the resistance of the controllable conductive path 7d of the p-channel MOSFET 7, depending on the voltage drop at the resistive element 3. The transistor 7 is furthermore configured to control the p-channel MOSFET 2 to increase the resistance of its controllable conductive path 2a with an increasing voltage drop at the resistive element 3. Circuit 1 furthermore comprises a second resistive element 8, which is a resistor in this embodiment. The resistive element 3 and the second resistive element 8 may be formed in a polysilicon layer of an integrated circuit and, hence, may be formed as a polysilicon resistance. The second resistive element 8 is configured as a load resistor which is coupled between the transistor 7 (or the controllable conductive path 7d thereof) and a second potential present at a second potential feed 9. In this embodiment, the second potential may be a ground potential VSSP.

The circuit 1 further comprises an enable sub-circuit 30, which is configured to enable or disable the circuit 1 in dependence on an enable signal 31. The enable sub-circuit 30 may comprise an inverter structure 35 with a p-channel transistor 35a circuited in series to an n-channel transistor 35b, wherein the source terminal of the transistor 35b is connected to the ground potential (VSSP!*) 9 and the source terminal of the transistor 35a is connected to the feed potential VDDP!*.

The respective control terminals of the transistors 35a, 35b are connected to the enable signal 31. The enable sub-circuit 30 may further comprise the p-channel MOSFET transistors 32 and 34 and an n-channel transistor 33. The enable sub-circuit 30 is configured to interrupt, disconnect or connect upon a respective enable signal 31, the transistor 7 from the transistor 2, as well as the transistor 7 and the second resistive element 8. In other words, the enable sub-circuit is configured to disable the transistor 2 in a disable-state and to interrupt a current flow through the load resistor or bias-resistor 8 in the disable state. Also, a drain-source current of the transistor 7 is disabled by the enable sub-circuit in the disable-state. Moreover, in some embodiments the pad 5 can be disconnected or connected to the circuit depending on the enable signal 31. The enable sub-circuit 30 can suppress or minimize an undesirable current flow under static conditions or non-operative conditions of the circuit. The function of the pull-up circuit 1 is described above. That means, depending on a voltage drop at the resistive element 3, the transistor 7 controls, if the enable signal turns on the transistor 32 and 33, the transistor 2 such that the resistance of the conductive paths 2a of the transistor 2 is increased depending on (or in respect to) a current flow through the resistive element 3 of the circuit 1.

The pad 5 may be, in this embodiment, an ISO pad (ISO7816IFC) with a maximum current of 20 μA. Transistors, some of the circuit 1 may (in some embodiments) be fabricated in a complementary-metal-oxide-semiconductor (CMOS) 120 nm process technology.

Figure 4:
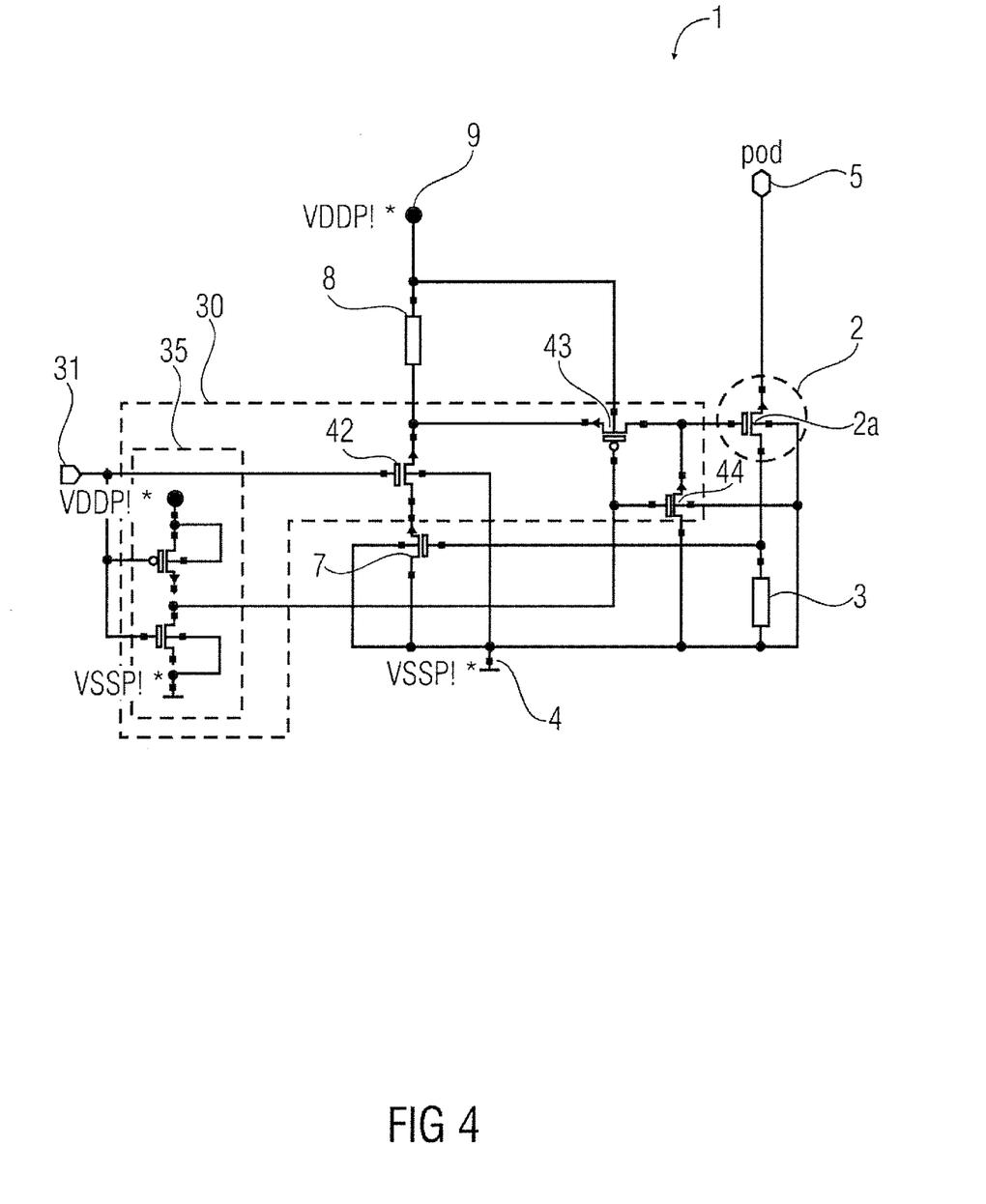
FIG. 4 shows a circuit diagram of a pull-down circuit with a sub-circuit for enabling, or disabling, a pull-down circuit according to another embodiment of the invention.

The circuit diagram in FIG. 4 depicts another embodiment according to the invention. According to this embodiment, the circuit 1 is a pull-down circuit which is configured to pull the potential at the pad 5 towards a feed potential. In this case, the feed potential is designated as VSSP!*, which may be the ground potential 4. The circuit 1 in FIG. 4 also includes an enable sub-circuit 30 which is configured to enable or disable the pull-down circuit depending on the enable signal 31. The enable sub-circuit 30 comprises, as already described in the context of FIG. 3, an inverter 35 comprising a p-channel MOSFET 35a, whose source terminal region, in this embodiment, is connected to the second feed potential VDDP!* 9, and an n-channel MOSFET 35b in series to the p-channel MOSFET 35a, whose source terminal region is connected to the feed potential 4 which is the ground potential VSSP!*. The control terminals or gate terminals of the transistors 35a and 35b are connected to the enable signal 31. The enable sub-circuit 30 in this pull-down circuit further comprises two n-channel MOSFET transistors 42 and 44, and a p-channel MOSFET transistor 43. The transistors 42 and 43 are configured to disconnect or connect the control element 7, which is a n-channel MOSFET (NMOS) transistor, and the first transistor 2, which is also an NMOS transistor. In addition, the second resistive element 8 can be connected to the control element or disconnected from the control element 7 in dependence on the enable signal 31 using the transistor 42. The second resistive element 8 may be formed as (or using) a transistor wherein the channel length L is much higher than the channel width of the respective transistor. The pad 5 of the circuit 1 can be connected or disconnected to the circuit 1 by the NMOS transistor 44, which is also coupled to the enable signal 31. The disconnection of the pad may be performed in order to reduce or minimize a current flow in the circuit during a non-operative state of the circuit. In other words, if the transistor is in an on-state (e.g. if the enable signal 31 indicates a disable-state), the controlled path 2a of the transistor 2 is set to a high-impedance state or off-state. Thus, a pull-down of the pad 5 is disabled in this case.

The principle of operation of the first transistor 2 with its controllable path 2a and of the resistive element 3, which are coupled in series between the pad 5 and the potential feed 4, has already been described in the foregoing. This means that the control element 7 is configured to control the first transistor 2 to change the resistance of the controllable conductive path of the NMOS transistor 2, depending on a voltage drop at the resistor 3. The resistor 8 may again act as a load resistor. The resistors 8 and 3 may be formed as poly-resistors. The circuit 1 may be part of an integrated chip wherein the integrated chip may comprise a couple of I/O pads (e.g. one or more I/O pads), and wherein each of these pads comprises a pull-up or pull-down circuit as described therein.

It should be noted that the control element 7 can, for example, be a MOSFET or a bipolar transistor, and may therefore comprise a threshold voltage or a flow voltage. Such a control element may be configured, such that the resistance of the controllable conductive path of the control element is drastically reduced, if the voltage drop at the resistive element 3 is such, that a voltage at the control terminal of the control element 7 is higher than the threshold voltage or the flow voltage of the control element. The resistance of the controllable conductive path of the first transistor 2 is maximal, or drastically increased.

According to another embodiment of the invention, the circuit is configured to compare a voltage drop at the resistive element 3 with a threshold voltage or flow voltage of the control element 7. An excess of the threshold voltage provokes the first transistor 2 to increase the resistance between the potential feed 4 and the node 5 of the circuit 1. The control element may for example be a FET or a respective bipolar transistor.

Figure 5:
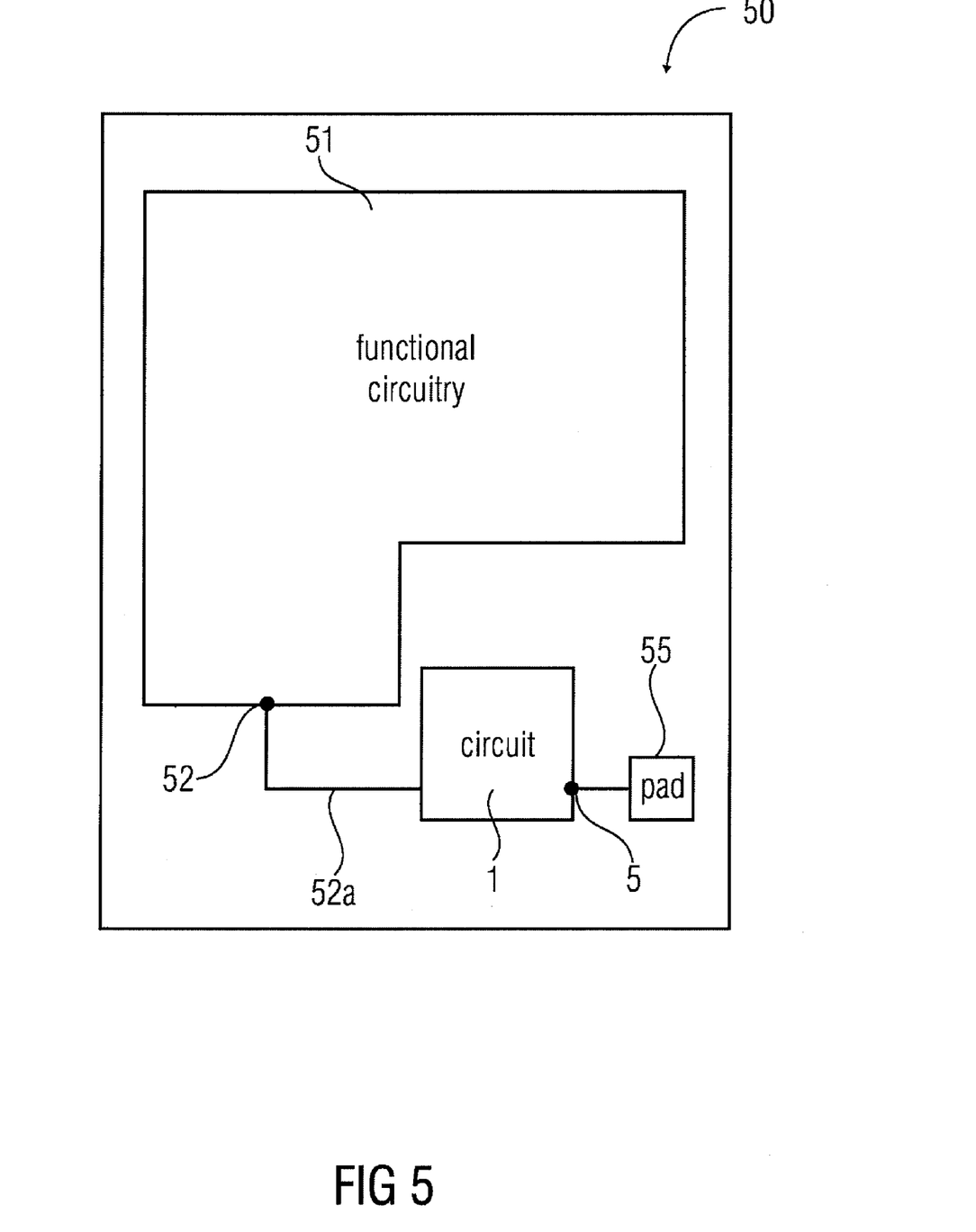
FIG. 5 shows a schematic drawing of an integrated circuit which comprises a functional circuitry, a connection for an information carrying signal, a pad, and a circuit according to an embodiment of the invention.

In another embodiment, the circuit according to the present invention may be integrated in an integrated circuit chip (IC). In FIG. 5, such an integrated circuit 50 is schematically depicted in a block diagram. In this embodiment, the integrated circuit 50 comprises a functional circuitry 51, at least one connection for an information carrying signal 52, a circuit 1 as described herein, and a pad 55. The pad 55 is coupled to the node 5 of the circuit 1 and to the connection for the information carrying signal 52. The circuit 1 may be configured to pull the pad to a certain feed potential in the absence of a dominant information carrying signal at the pad.

The integrated circuit 50 may for example be a logic chip, a memory chip or any other functional microchip. The pad 55 may be an input pad and/or an output pad for input signals and/or output signals. The integrated circuit 50 may be configured to receive or send information or a signal via the pad 55. The information carrying signal may for example be a data signal, a control signal, or a command signal. The circuit, whose node 5 is connected to the pad 55, may, as described in embodiments, be a pull-up circuit or a pull-down circuit. The integrated circuit of the microchip 50 can comprise a plurality of pads 55 with respective pull-up circuits or pull-down circuits. The pull-up circuits and the pull-down circuits may have the task to keep the input voltage of the pads at a predetermined value—the feed potential, if there is no input signal or no dominant information carrying signal which is applied at the pad 55.

This means that the pad may be pulled to a low signal level, for example, ground, or may be pulled to a high signal level, for example, 1.8 V. The potential at the pad 55 and the input voltage can be kept at a predetermined stable state, and the floating of the pad potential or input voltage at the pad can be avoided. By means of the circuit 1, a floating of a pad potential can be avoided. Such a floating of the pad potential may be provoked by noise or interference with other electrical signals.

In the circuit 1, different embodiments of which have been described herein, a significant current flow and therefore power consumption only takes place if the node 5 is pulled to the feed potential. In contrast, a conventional current source needs a reference current source which has to be continuously switched on, and which is therefore continuously consuming power.

The microchip 50 may comprise several pads 55, wherein each of the pads comprises a dedicated circuit 1 which is configured to pull the potential at the dedicated pad to a predetermined feed potential. Since the circuit 1 does not need a bandgap voltage of the microchip 50, each of the circuits 1 dedicated to the pads 55 may be considered as a "island solution". This means that each of the circuits 1 may be independent from a bandgap reference voltage provided by the microchip 50.

The pad 55 may be a ISO pad, wherein a maximum current in such a pad type is about 20 μA. This means that the resistive element 3 in the circuit 1 may comprise such a resistance that a current flow in the circuit is close to the 20 μA for an ISO pad. The current in the circuit 1 is limited by the resistive element 3, which can be easily adapted to the respective needs of the circuit 1.

Figure 6:
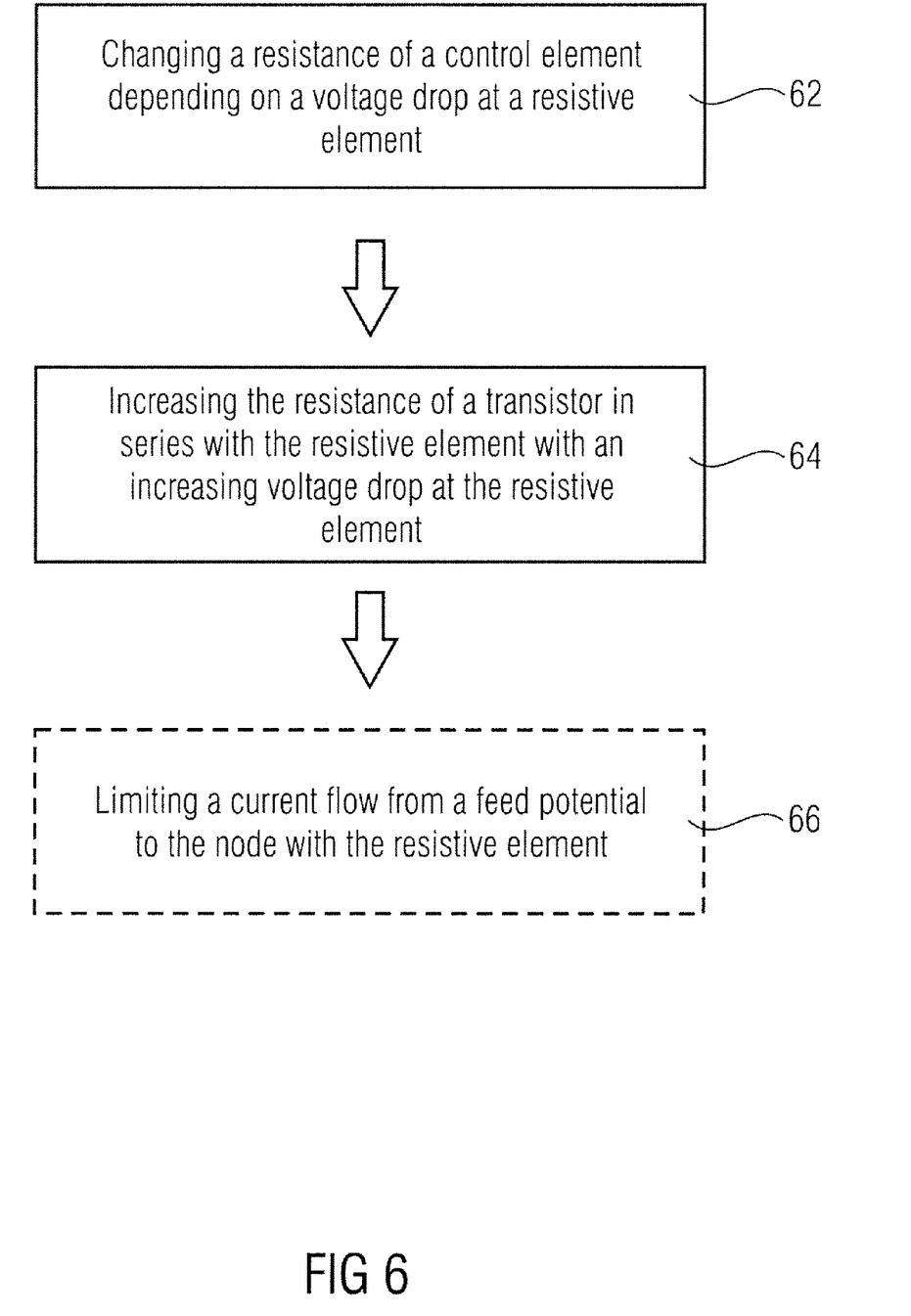
FIG. 6 shows a flow-chart of a method for pulling a potential at a node towards a feed potential according to an embodiment of the invention.

In FIG. 6, a flow chart of a method of pulling a potential at a node towards a feed potential present at a potential feed is depicted. In this embodiment, the method comprises changing 62 the resistance of a controllable conductive path of a control element, depending on a voltage drop at a resistive element. The resistive element is coupled in series to the controllable conductive path of a first transistor between the potential feed and the node. The method further comprises increasing 64 the resistance of the controllable conductive paths of the first transistor with an increasing voltage drop over the resistive element using the control element.

According to another embodiment of the method, the resistance is changed if a voltage drop at the resistive element is such that a control voltage of the control element, which control voltage is dependent on the voltage drop, exceeds a threshold voltage of the control element.

The method may further comprise limiting 66 a current flow from the feed potential to the node by a resistive element. Moreover the method may be performed such that a control voltage of the control element depends on a voltage drop at the resistive element.

In embodiments of the invention, the current flows (through a resistor) in the pull-up circuit or pull-down circuit. The voltage drop over the resistor is compared with the transistor threshold voltage or transistor flow voltage of a control element. If the threshold voltage or the flow voltage (for a bipolar transistor) is exceeded, the resistance between the pad terminal and the feed potential is actively increased by the resistance of a transistor which is arranged in series with the resistor between the pad terminal and the feed potential. This means that depending on the threshold voltage or the flow voltage of the control transistor, the resistance in the pull-up or pull-down paths is increased. In the way the current flow through the resistor 3 is measured, for example using the control transistor 7. If the transistor arranged in series with the resistor 3 exceeds a predetermined current through the resistor the pull-up or pull-down resistance is increased.

While the foregoing has particularly been shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow. All such similar substitutes and modifications apparent to those skilled in the art are then to be within the spirit, scope, and concept of the disclosure as defined by the appended claims.

The invention claimed is:

1. An integrated circuit, comprising
   a functional circuitry comprising a connection for an information carrying signal;
   a circuit for pulling a potential at a node towards a feed potential present at a potential feed, the circuit comprising:
      a first transistor comprising a controllable conductive path and a resistive element, wherein the controllable conductive path of the first transistor and the resistive element are coupled in series between the potential feed and the node, and
      a control element configured to control the first transistor to change the resistance of the controllable conductive path of the first transistor depending on a voltage drop at the resistive element;
   an input pad or an output pad or an input/output pad,
   wherein the input pad or output pad or input/output pad is coupled to the node of the circuit and to the connection for the information carrying signal, wherein the circuit is configured to pull the input pad or the output pad or the input/output pad to the feed potential in the absence of the dominant information carrying signal, and wherein the functional circuitry is configured to receive or send information via the input pad or via the output pad or via the input/output pad using the information carrying signal.

2. The integrated circuit according to claim 1, wherein the circuit is configured such that the control element controls the first transistor to increase the resistance of the controllable conductive path with increasing voltage drop at the resistive element.

3. The integrated circuit according to claim 1, wherein the control element comprises a second transistor, wherein the second transistor comprises a control terminal configured to change a resistance of a controllable conductive path of the second transistor depending on the voltage drop at the resistive element.

4. The integrated circuit according to claim 1, wherein the second transistor is coupled to the resistive element such that a control voltage of the second transistor increases with increasing voltage drop of the resistive element.

5. The integrated circuit according to claim 1, wherein the control element comprises a threshold voltage, and wherein the control element is configured such that the current flowing through the control element is drastically increased, if the voltage drop at the resistive element is such that a voltage at the control element is according to an amount higher than the threshold voltage of the control element and the resistance of the controllable conductive path of the first transistor is drastically increased.

6. The integrated circuit according to claim 1, further comprising a second resistive element configured as a load resistor coupled between the control element and the second potential present at the second potential feed configured to carry the second feed potential.

7. The integrated circuit according to claim 1, wherein the second resistive element comprises a third transistor.

8. The integrated circuit according to claim 1, wherein the first transistor is a metal oxide semiconductor field effect transistor (MOSFET).

9. The integrated circuit according to claim 1, further comprising an enable sub-circuit configured to enable or disable the circuit in dependence on an enable signal.

10. The integrated circuit according to claim 1, wherein the circuit is a pull-up circuit and the feed potential comprises a voltage less than 6V.

11. The integrated circuit according to claim 1, wherein the circuit is a pull-down circuit and the feed potential is a ground potential.

12. The integrated circuit according to claim 1, further comprising a pad of a microchip coupled to the node.

13. The integrated circuit according to claim 1, configured such that a current flow, during pulling the node towards a feed potential between the feed potential and the node is between 1 µA and 100 µA.

14. The integrated circuit according to claim 1, configured such that the resistive element comprises a resistance between 5 kΩ and 100 kΩ.

15. The integrated circuit according to claim 1, configured such that a variation of the current through the controllable conductive path of the first transistor in a pull-up state or in a pull-down state is limited to a range from 10% to 100%.

16. A circuit for pulling a potential at a pad towards a feed potential present at a potential feed, the circuit comprising:
   a first transistor comprising a controllable conductive path and a resistive element, wherein the controllable conductive path of the first transistor and the resistive element are coupled in series between the potential feed and the node;
   a field effect transistor (FET) comprising a control terminal configured to change a resistance of a controllable conductive path of the FET depending on the voltage drop at the resistive element, wherein said FET is configured to control the first transistor to increase the resistance of the controllable conductive path with increasing voltage drop at the resistive element;
   a second resistive element, configured as load resistor coupled between the FET and a second potential present at a second potential feed configured to carry a second feed potential, and
   an enable sub-circuit configured to enable or disable the circuit in dependence on an enable signal, wherein the enable sub-circuit is configured to disconnect or connect, upon the enable signal, the first transistor and the FET as well as the FET and the second resistive element.

17. The circuit according to claim 16, wherein the circuit is a pull-up circuit and the first transistor and the FET are p-channel MOSFETs.

18. The circuit according to claim 16, wherein the circuit is a pull-down circuit and the first transistor and the FET are n-channel MOSFETs.

19. The circuit according to claim 16, wherein the FET comprises a threshold voltage or a flow voltage and wherein the FET is configured such that the resistance of the controllable conductive path of the FET is drastically reduced if the voltage drop at the resistive element is such that a voltage at the control terminal is according to an amount higher than the threshold voltage or the flow voltage of the FET and the resistance of the controllable conductive path of the first transistor is maximal.

20. The circuit according to claim 16, wherein a current flow between the feed potential and the node is limited by the resistive element.

21. The circuit according to claim 16, wherein the circuit is configured to compare the voltage drop at the resistive element with a threshold voltage or a flow voltage of the FET and wherein an excess of the threshold voltage FET provokes the first transistor to increase the resistance between the potential feed and the node.

22. A method for pulling a potential at a node towards a feed potential present at a potential feed, the method comprising:
   receiving or sending information using an information carrying signal via an input pad or an output pad or an input/output pad, wherein the input pad or the output pad or the input/output pad is coupled to the node;
   changing a resistance of a controllable conductive path of a control element depending on a voltage drop at an resistive element, wherein the resistive element is coupled in series with controllable conductive paths of a transistor between the potential feed and the node; and
   increasing the resistance of the controllable conductive path of the transistor with an increasing voltage drop at the resistive element as a control element, such that the input pad or the output pad or the input/output pad is pulled to the feed potential in the absence of a dominant information carrying signal.

23. The method according to claim 22, wherein changing the resistance is performed upon an excess of a threshold voltage at the control element depending on a voltage drop at the resistive element.

24. The method according to claim 22, further comprising:
   limiting a current flow from the feed potential to the node by a resistive element.

25. The integrated circuit according to claim 1, wherein the information carrying signal is a data signal, a control signal or a command signal.

26. The method according to claim 22, wherein the information carrying signal is a data signal, a control signal or a command signal.

* * * * *